United States Patent
Mao et al.

(10) Patent No.: US 10,178,771 B2
(45) Date of Patent: Jan. 8, 2019

(54) CIRCUIT BOARD, MANUFACTURING METHOD THEREOF AND DISPLAY APPARATUS

(71) Applicant: BOE TECHNOLOGY GROUP CO., LTD., Beijing (CN)

(72) Inventors: Defeng Mao, Beijing (CN); Yanbing Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/894,953

(22) PCT Filed: Jul. 20, 2015

(86) PCT No.: PCT/CN2015/084436
§ 371 (c)(1),
(2) Date: Nov. 30, 2015

(87) PCT Pub. No.: WO2016/107143
PCT Pub. Date: Jul. 7, 2016

(65) Prior Publication Data
US 2016/0345436 A1    Nov. 24, 2016

(30) Foreign Application Priority Data

Dec. 31, 2014   (CN) .......................... 2014 1 0853467

(51) Int. Cl.
*H05K 1/18*          (2006.01)
*H05K 1/11*          (2006.01)
(Continued)

(52) U.S. Cl.
CPC ............ *H05K 1/181* (2013.01); *H05K 1/111* (2013.01); *H05K 3/301* (2013.01);
(Continued)

(58) Field of Classification Search
CPC ........ H05K 1/111; H05K 1/181; H05K 3/301; H05K 3/341; H05K 2201/0108;
(Continued)

(56) References Cited

U.S. PATENT DOCUMENTS

| | | | | |
|---|---|---|---|---|
| 5,684,677 A | * | 11/1997 | Uchida | ................... H05K 3/303 |
| | | | | 174/260 |
| 5,969,461 A | * | 10/1999 | Anderson | ................ H01L 24/32 |
| | | | | 174/260 |
| 2011/0074037 A1 | * | 3/2011 | Takeshima | .......... H01L 23/3128 |
| | | | | 257/773 |

FOREIGN PATENT DOCUMENTS

| | | |
|---|---|---|
| CN | 2394329 | 8/2000 |
| CN | 1305662 | 7/2001 |

(Continued)

OTHER PUBLICATIONS

International Search Report from PCT Application No. PCT/CN2015/084436, dated Sep. 25, 2015, 2 pages.
(Continued)

*Primary Examiner* — Hoa C Nguyen
(74) *Attorney, Agent, or Firm* — Harness, Dickey & Pierce, P.L.C.

(57) ABSTRACT

The embodiments of present invention disclose a circuit board and a manufacturing method thereof and a display apparatus comprising the circuit board. The circuit board comprises a base substrate, a device to be soldered, a bonding pad and a support, wherein the bonding pad and the support are provided on the base substrate, and the device to be soldered is provided on the support and is connected with the bonding pad. By providing the device to be soldered on the support, the embodiments of present invention can effectively prevent the short circuit of the device to be soldered during the process of soldering and thus improve product yield.

15 Claims, 5 Drawing Sheets

(51) Int. Cl.
  *H05K 3/30* (2006.01)
  *G02F 1/1345* (2006.01)
  *H05K 3/34* (2006.01)

(52) U.S. Cl.
  CPC .......... *G02F 1/13452* (2013.01); *H05K 3/341* (2013.01); *H05K 2201/0108* (2013.01); *H05K 2201/10128* (2013.01); *H05K 2201/10287* (2013.01); *H05K 2201/10318* (2013.01); *H05K 2203/049* (2013.01); *Y02P 70/611* (2015.11)

(58) Field of Classification Search
  CPC .......... H05K 2201/10128; H05K 2201/10287; H05K 2201/10318; H05K 2203/049; G02F 1/13452
  See application file for complete search history.

(56) References Cited

FOREIGN PATENT DOCUMENTS

| | | |
|---|---|---|
| CN | 202394963 | 8/2012 |
| CN | 103123916 | 5/2013 |
| CN | 103650129 | 3/2014 |
| CN | 104602450 | 5/2015 |

OTHER PUBLICATIONS

Written Opinion of the International Searching Authority from PCT Application No. PCT/CN2015/084436, dated Sep. 25, 2015, 5 pages.
Office Action from corresponding Chinese Application No. 201410853467.0, dated Mar. 2, 2017 (8 pages).

\* cited by examiner

CIRCUIT BOARD, MANUFACTURING METHOD THEREOF AND DISPLAY APPARATUS

FIELD OF THE INVENTION

The embodiments of present invention relate to a field of display technology, and particularly relate to a circuit board, a manufacturing method thereof and a display apparatus comprising the circuit board.

BACKGROUND

In the field of display technology, the application of liquid crystal display apparatuses is becoming more and more extensive. FIG. 1 is a structural schematic diagram of a liquid crystal display apparatus in the prior art. As shown in FIG. 1, the liquid crystal display apparatus may comprise a liquid crystal display panel 1 and a control circuit. The liquid crystal display panel 1 may comprise a color film substrate 11 and an array substrate 12 that may each comprise a base substrate. The control circuit may comprise a plurality of circuit modules, which may be a power module 21, a system module 22, a timing control module 23 or the like. The power module 21, the system module 22 and the timing control module 23 are disposed on three printed circuit boards (PCBs) respectively. The power module 21 and the system module 22 are each connected with the timing control module 23 via copper wires 24, and the timing control module 23 is connected with the liquid crystal display panel 1 via a flexible printed circuit board (FPC) 25, thereby achieving electrical control of the liquid crystal display apparatus.

However, the following technical problems exist in the above technical solution in the prior art.

1) The circuit module disposed on the PCB has too many pins, which often causes a problem of short circuit during the process of soldering, and thus the product yield may be lowered.

2) The material of the base substrate in the liquid crystal display panel is different from the material of the carrier (i.e., PCB) of the circuit modules in the control circuit, and the base substrate is generally produced by a manufactory different from the manufactory that produces the PCB, therefore the product manufacturing cycle may be long.

3) The thickness of the liquid crystal display apparatus is increased because the PCB has a large thickness and needs to be disposed on the back side of the liquid crystal display panel 1.

4) Various circuit modules (for example, power module 21, system module 22, timing control module 23, or the like) are needed to be disposed on their respective PCBs, resulting in a large space occupied by the circuit modules, low integration level, high circuit impedance, long path length and slow operation.

BRIEF SUMMARY OF THE DISCLOSURE

The embodiments of present invention provide a circuit board, a manufacturing method thereof and a display apparatus comprising the circuit board so as to prevent short circuit of a device to be soldered during the process of soldering and thus improve the product yield.

The first aspect of the present invention provides a circuit board comprising a base substrate, a device to be soldered, a bonding pad and a support, wherein the bonding pad and the support are provided on the base substrate, and the device to be soldered is provided on the support and is connected with the bonding pad.

Optionally, each of the number of the device to be soldered and the number of the support is one or more, and there is a one-to-one correspondence between the device to be soldered and the support.

Optionally, the base substrate is a transparent substrate.

Optionally, a height of the support is larger than a height of the bonding pad.

Optionally, the device to be soldered is a circuit module which corresponds to at least three bonding pads, and the support is positioned among the at least three bonding pads to which the circuit module corresponds.

Optionally, the circuit module comprises at least three pins, each of which faces toward the base substrate, and the pins of the circuit module are connected with the bonding pads respectively.

Optionally, the circuit module comprises at least three pins, each of which faces away from the base substrate, and the pins of the circuit module are connected with the bonding pads respectively.

Optionally, the number of the pins of the circuit module is equal to the number of the bonding pads to which the circuit module corresponds.

Optionally, a material of the support is metal, a packaging structure is provided on a packaging side of the circuit module, the packaging side of the circuit module is a side of the circuit module facing toward the support and is opposite to a side of the circuit module where the pins of the circuit module are located.

Optionally, a material of the support is an insulating material.

Optionally, a material of the bonding pad is a transparent conductive material.

Optionally, the circuit board further comprises a packaging layer that is positioned on the device to be soldered and the bonding pad and covers the base substrate.

The second aspect of the present invention provides a display apparatus comprising a display panel and the above described circuit board connected with the display panel.

The third aspect of the present invention provides a manufacturing method of a circuit board which comprises steps of:

providing a device to be soldered, a bonding pad and a support on a base substrate such that the device to be soldered is positioned on the support, and connecting the device to be soldered with the bonding pad.

Optionally, the step of providing the device to be soldered, the bonding pad and the support on the base substrate specifically comprises:

providing the bonding pad on the base substrate;
providing the support on the base substrate;
providing the device to be soldered on the support such that pins of the device to be soldered face toward the base substrate; and
connecting the pins of the device to be soldered with the bonding pad.

Optionally, the step of providing the device to be soldered, the bonding pad and the support on the base substrate specifically comprises:

providing the bonding pad on the base substrate;
providing a packaging structure on a packaging side of the device to be soldered which is opposite to a side of the device to be soldered where pins of the device to be soldered are located;

providing the device to be soldered on the support via the packaging structure such that the packaging side of the device to be soldered faces toward the support; and providing the support with the device to be soldered provided thereon on the base substrate and connecting the pins of the device to be soldered with the bonding pad.

Optionally, the step of providing the bonding pad on the base substrate specifically comprises:

depositing a bonding pad material layer on the base substrate and forming the bonding pad material layer into the bonding pad through a patterning process.

Optionally, the manufacturing method further comprises, subsequent to the step of connecting the device to be soldered with the bonding pad, integrally packaging the base substrate in a dropping-from-top manner such that a packaging layer is formed on the device to be soldered and the bonding pad and the packaging layer covers the base substrate.

Optionally, the device to be soldered is a circuit module.

The embodiments of present invention provide the following beneficial effects:

in the solutions of the circuit board, the manufacturing method thereof and the display apparatus comprising the circuit board provided by the aspects of present invention, by providing the device to be soldered on the support, the short circuit of the device to be soldered during the process of soldering may be effectively prevented and thus the product yield is improved.

DETAILED DESCRIPTION

A circuit board, a manufacturing method thereof and a display apparatus comprising the circuit board provided by the embodiments of the present invention will be described in detail hereinafter in conjunction with the accompanying drawing and embodiments so that one person skilled in the art will have a better appreciation to the technical solutions of the embodiments of the present invention.

First Embodiment

Figure 1:
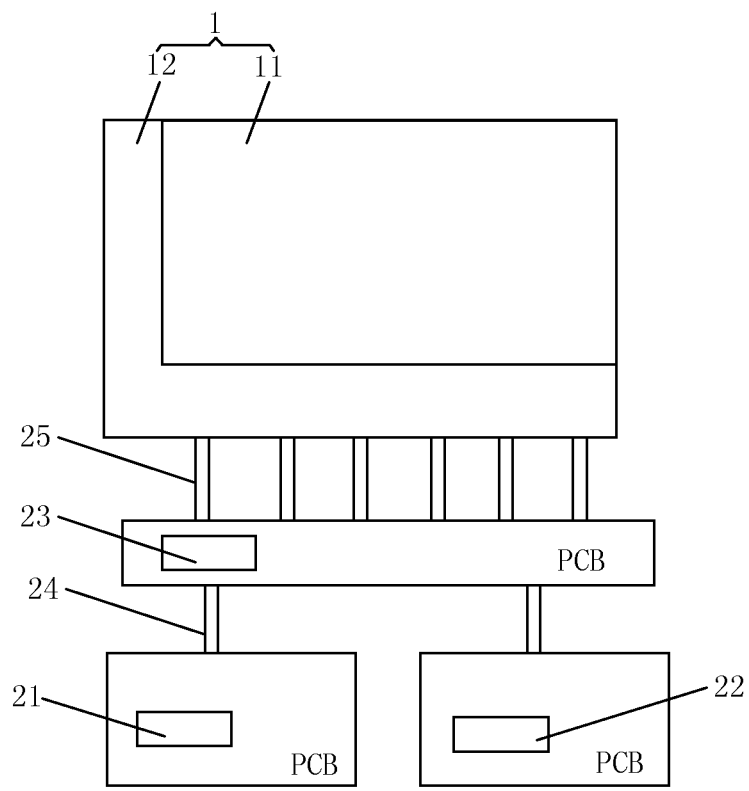
FIG. 1 is a structural schematic diagram of a liquid crystal display apparatus in the prior art.
Figure 2:
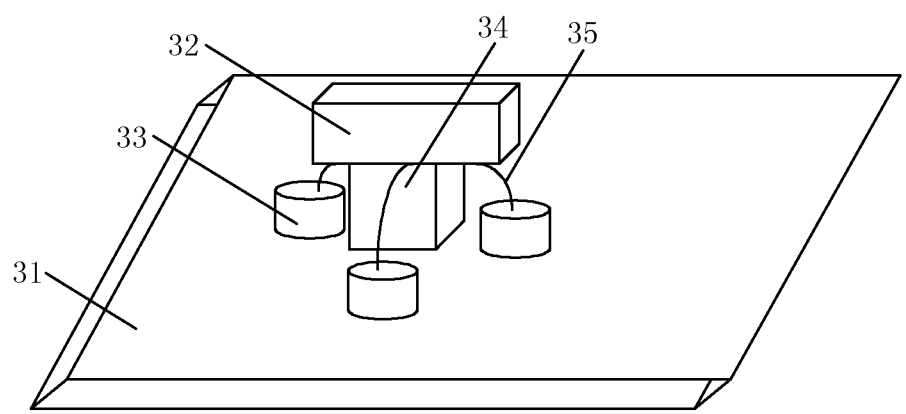
FIG. 2 is a structural schematic diagram of a circuit board provided by a first embodiment of the present invention.

FIG. 2 is a structural schematic diagram of a circuit board provided by the first embodiment of the present invention. As shown in FIG. 2, the circuit board comprises a base substrate 31, a device to be soldered 32, a bonding pad 33 and a support 34. The bonding pad 33 and the support 34 are provided on the base substrate 31, and the device to be soldered 32 is provided on the support 34 and is connected with the bonding pad 33.

It is noted that the device to be soldered may be either an existing circuit module or a device commonly used in a circuit board, such as a resistor, a capacitor or the like. A circuit module will be taken as an example of the device to be soldered in the description of the present embodiment. Each of the number of the circuit module and the number of the support 34 may be one or more. Furthermore, one circuit module is taken as an example in the present embodiment, and the circuit module may be a power module, a system module or a timing control module. In the present embodiment, the circuit module may otherwise be other functional module(s), examples of which will not be specifically listed herein.

The base substrate 31 may be a transparent substrate. Specifically, a material of the base substrate 31 may be glass.

As compared with the prior art in which the circuit module is provided on the PCB, the present embodiment replaces the PCB in the prior art with a base substrate, i.e., the circuit module is provided on the base substrate. Because the base substrate in the circuit board may use a same material as the base substrate in the display panel, the circuit board and the display panel can be produced by a same manufactory and thus product manufacturing cycle can be shortened. Furthermore, the thickness of the base substrate is smaller than the thickness of the PCB, therefore the thickness of the display apparatus can be decreased, which provides solutions for developing an ultra-thin display apparatus in the future. As compared with the prior art in which different circuit modules need to be provided on different PCBs, all the circuit modules can be provided on a same base substrate in the present embodiment, which reduces the space occupied by the circuit modules, increases the integration level, decreases the circuit impedance, shortens the path length, and increases the operation speed. The material of the base substrate may be glass, and thus the problem of short circuit easily occurring during the process of soldering the circuit module on the PCB in the prior art can be avoided.

Preferably, there is a one-to-one correspondence between the device to be soldered 32 and the support 34, i.e., there is a one-to-one correspondence between the circuit module and the support.

In the present embodiment, the material of the support 34 may be an insulating material. Specifically, the insulating material may comprise $SiN_x$ or $SiO_x$. By using the insulating material for the support, the short circuit of the circuit module during the process of soldering can be effectively prevented.

Preferably, a height of the support 34 is larger than a height of the bonding pad 33, which makes it more effectively to prevent the short circuit of the circuit module during the process of soldering.

The number of the bonding pad 33 corresponding to the circuit module may be at least three, and the number of the bonding pad 33 corresponding to each circuit module may be the same as the number of the pins of the circuit module. In the present embodiment, three is taken as an example of each of the number of the bonding pad 33 and the number of the pins of the circuit module (as shown in FIG. 2). The support 34 is positioned among the at least three bonding pads 33 corresponding to the circuit module, i.e., the at least three bonding pads 33 corresponding to the circuit module are arranged around the support 34.

In the present embodiment, the circuit module comprises at least three pins, each of which faces toward the base substrate 31, and the pins of the circuit module may be connected with the bonding pads 33. Specifically, the pins of the circuit module may be connected with the bonding pads 33 via bonding wires 35, which may be soldered to the bonding pads 33 by using solder. For example, the solder may include A6D/HA6 silver conductive adhesive of SeaZheng Co., LTD. or HF-1021AB copper conductive adhesive of Hua Fei New Material. The solder is not limited herein as long as it can solder the bonding wires 35 and the bonding pad 33 together well. In the present embodiment, since the pins of the circuit module may be connected with the bonding pads 33 via the bonding wires 35 such that there is no need to provide additional wires for connection between the pins of the circuit module and the bonding pads 33, the distance between the circuit module and the bonding pads 33 is shortened, which makes the distance between the circuit module and the bonding pads 33 shorter, and the connection strength and reliability are also increased.

The material of the bonding pads 33 may be a transparent conductive material. Specifically, the transparent conductive material may be indium tin oxide (ITO).

Further, the circuit board may further comprise a packaging layer (not shown in FIG. 2) that is positioned on the circuit module and the bonding pads 33 and covers the base substrate 31 so as to package the base substrate 31, the circuit module and the bonding pads 33 into an integral body. The material of the packaging layer may be epoxy resin. By using epoxy resin as a packaging material to integrally package the circuit board, the packaging cost can be reduced.

Further, the circuit board may further comprise a wire (not shown in FIG. 2) provided on the base substrate 31. The wire has one end connected with the bonding pads 33 and the other end connected with the display panel.

In the technical solution of the circuit board provided by the present embodiment, the bonding pad and the support are provided on the base substrate, the device to be soldered (for example, the circuit module) is provided on the support and is connected with the bonding pad, therefore the short circuit of the device to be soldered during the process of soldering can be effectively prevented and the product yield can be increased. As compared with the prior art in which the device to be soldered is provided on the PCB, the present embodiment replaces the PCB in the prior art with the base substrate, i.e., the device to be soldered is provided on the base substrate. Because the base substrate in the circuit board may use a same material as the base substrate in the display panel, the circuit board and the display panel can be produced by a same manufactory and thus product manufacturing cycle can be shortened. Furthermore, the thickness of the base substrate is smaller than the thickness of the PCB, therefore the thickness of the display apparatus is decreased, which provides a solution for developing an ultra-thin display apparatus in the future. As compared with the prior art in which different circuit modules need to be provided on different PCBs, all the devices to be soldered may be provided on a same base substrate in the present embodiment, therefore the space occupied by the devices to be soldered is reduced, the integration level is increased, the circuit impedance is decreased, the path length is shortened, and the operation speed is increased. In the present embodiment, since a transparent substrate may be used as the base substrate and the material of the bonding pad may be a transparent conductive material, the fabricated circuit board is transparent except the soldering area (i.e., the area where the circuit module is soldered), which brings a better visual perception to the customers as compared with the opaque PCB in the prior art.

Second Embodiment

Figure 3:
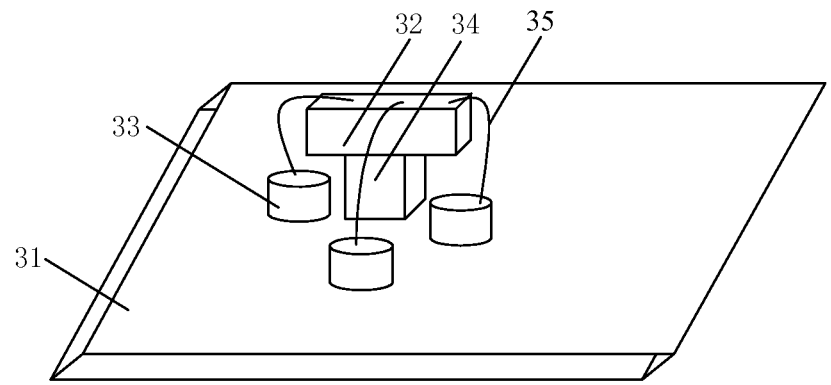
FIG. 3 is a structural schematic diagram of another circuit board provided by a second embodiment of the present invention.

FIG. 3 is a structural schematic diagram of another circuit board provided by a second embodiment of the present invention. As shown in FIG. 3, the circuit board comprises a base substrate 31, a circuit module, a bonding pad 33 and a support 34, wherein the bonding pad 33 and the support 34 are provided on the base substrate 31, the circuit module is provided on the support 34, and the circuit module is connected with the bonding pad 33.

In the present embodiment, each of the number of the circuit module and the number of the support 34 may be one or more. Furthermore, one circuit module is taken as an example in the present embodiment, and the circuit module may be a power module, a system module or a timing control module.

The base substrate 31 may be a transparent substrate. Specifically, a material of the base substrate 31 may be glass.

Preferably, there is a one-to-one correspondence between the circuit module and the support 34.

In the present embodiment, the material of the support 34 may be metal. Specifically, the metal may be copper. By using metal as the material of the support 34, the heat dispersion performance of the circuit module provided thereon can be improved. Furthermore, a packaging structure (not shown in FIG. 3) may be provided on the packaging side of the circuit module for packaging the circuit module on the support 34. In FIG. 3, the packaging side of the circuit module is a side of the circuit module that faces toward the support 34, and the packaging side of the circuit module is opposite to a side of the circuit module where the pins of the circuit module are located. Preferably, the material of the packaging structure is epoxy resin. The packaging structure of the circuit module may be connected with the support 34 via a heat conductive material which for example is silver paste.

Preferably, a height of the support 34 is larger than a height of the bonding pad 33, which makes it more effectively to prevent the short circuit of the circuit module during the process of soldering.

The number of the bonding pad 33 corresponding to the circuit module may be at least three, and the number of the bonding pad 33 corresponding to each circuit module may be the same as the number of the pins of the circuit module.

In the present embodiment, three is taken as an example of each of the number of the bonding pad 33 and the number of the pins of the circuit module (as shown in FIG. 3). The support 34 is positioned among the at least three bonding pads 33 corresponding to the circuit module, i.e., the at least three bonding pads 33 corresponding to the circuit module are arranged around the support 34.

In the present embodiment, the circuit module comprises at least three pins, each of which faces away from the base substrate 31, and the pins of the circuit module are connected with the bonding pads 33. Specifically, the pins of the circuit module may be connected with the bonding pads 33 via bonding wires 35, which may be soldered to the bonding pads 33 by using solder. For example, the solder may include A6D/HA6 silver conductive adhesive of SeaZheng Co., LTD. or HF-1021AB copper conductive adhesive of Hua Fei New Material. The solder is not limited herein as long as it can solder the bonding wires 35 and the bonding pads 33 together well. In the present embodiment, since the pins of the circuit module may be connected with the bonding pads 33 via the bonding wires such that there is no need to provide additional wires for connection between the pins of the circuit module and the bonding pads 33, the distance between the circuit module and the bonding pads 33 is shortened, which makes the distance between the circuit module and the bonding pads 33 shorter, and the connection strength and reliability are also increased.

The material of the bonding pads 33 may be a transparent conductive material. Specifically, the transparent conductive material may be indium tin oxide (ITO).

Further, the circuit board may further comprise a packaging layer (not shown in FIG. 3) that is positioned on the circuit module and the bonding pads 33 and covers the base substrate 31 so as to package the base substrate 31, the circuit module and the bonding pads 33 into an integral body. The material of the packaging layer may be epoxy resin. By using epoxy resin as a packaging material to integrally package the circuit board, the packaging cost can be reduced.

Further, the circuit board may further comprise a wire (not shown in FIG. 3) provided on the base substrate 31. The wire has one end connected with the bonding pads 33 and the other end connected with the display panel.

In the technical solution of the circuit board provided by the present embodiment, the bonding pad and the support are provided on the base substrate, the circuit module is provided on the support and is connected with the bonding pad, therefore the short circuit of the circuit module during the process of soldering can be effectively prevented and the product yield can be increased. As compared with the prior art in which the circuit module is provided on the PCB, the present embodiment replaces the PCB in the prior art with the base substrate, i.e., the circuit module is provided on the base substrate. Because the base substrate in the circuit board may use a same material as the base substrate in the display panel, the circuit board and the display panel can be produced by a same manufactory and thus product manufacturing cycle can be shortened. Furthermore, the thickness of the base substrate is smaller than the thickness of the PCB, therefore the thickness of the display apparatus is decreased, which provides a solution for developing an ultra-thin display apparatus in the future. As compared with the prior art in which different circuit modules need to be provided on different PCBs, all the circuit modules can be provided on a same base substrate in the present embodiment, therefore the space occupied by the circuit modules is reduced, the integration level is increased, the circuit impedance is decreased, the path length is shortened, and the operation speed is increased. In the present embodiment, since a transparent substrate may be used as the base substrate and the material of the bonding pad may be a transparent conductive material, the fabricated circuit board is transparent except the soldering area (i.e., the area where the circuit module is soldered), which brings a better visual perception to the customers as compared with the opaque PCB in the prior art.

Third Embodiment

Figure 4:
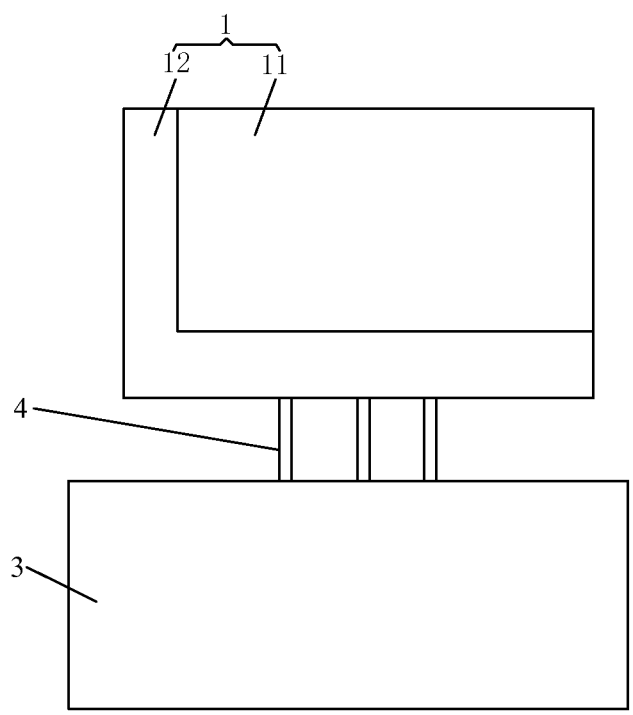
FIG. 4 is a structural schematic diagram of a display apparatus provided by a third embodiment of the present invention.

FIG. 4 is a structural schematic diagram of a display apparatus provided by a third embodiment of the present invention. As shown in FIG. 4, the display apparatus comprises a display panel 1 and a circuit board 3 connected with the display panel 1 which may be the circuit board provided in the first or second embodiment. For detailed description of the structure of the circuit board 3, reference may be made to the first embodiment and FIG. 2 or the second embodiment and FIG. 3, and no repeated description will be made herein.

The display panel 1 may comprise a color film substrate 11 and an array substrate 12 that are arranged opposed to each other. The display panel 1 may be connected with the circuit board 3 via a flexible printed circuit board (FPC) 4. In the present embodiment, the wires in the circuit board 3 which are connected with the bonding pads are connected with the display panel 1 via the FPC 4. Specifically, one end of the wires is connected with the bonding pads 33, the other end of the wires is connected with one end of the FPC 4 via an anisotropic conductive film (ACF, not shown in FIG. 4), and the display panel 1 is connected with the other end of the FPC 4 via an ACF, thereby achieving the connection of the display panel 1 with the circuit board 3 via the FPC 4.

In the technical solution of the display apparatus provided by the present embodiment, the bonding pad and the support are provided on the base substrate, the circuit module is provided on the support and is connected with the bonding pad, therefore the short circuit of the circuit module during the process of soldering can be effectively prevented and the product yield can be increased. As compared with the prior art in which the circuit module is provided on the PCB, the present embodiment replaces the PCB in the prior art with the base substrate, i.e., the circuit module is provided on the base substrate. Because the base substrate in the circuit board may use a same material as the base substrate in the display panel, the circuit board and the display panel can be produced by a same manufactory and thus product manufacturing cycle can be shortened. Furthermore, the thickness of the base substrate is smaller than the thickness of the PCB, therefore the thickness of the display apparatus is decreased, which provides a solution for developing an ultra-thin display apparatus in the future. As compared with the prior art in which different circuit modules need to be provided on different PCBs, all the circuit modules can be provided on a same base substrate in the present embodiment, therefore the space occupied by the circuit modules is reduced, the integration level is increased, the circuit impedance is decreased, the path length is shortened, and the operation speed is increased. In the present embodiment, since a transparent substrate may be used as the base substrate and the material of the bonding pad may be a transparent conductive material, the fabricated circuit board is transparent except the soldering area (i.e., the area where the circuit module is soldered), which brings a better visual perception to the customers as compared with the opaque PCB in the prior art.

Fourth Embodiment

The fourth embodiment of the present invention provides a manufacturing method of a circuit board, which comprises steps of providing a device to be soldered, a bonding pad and a support on a base substrate such that the device to be soldered is positioned on the support, and connecting the device to be soldered with the bonding pad.

It is noted that the device to be soldered may be a circuit module, which includes for example, but not limited to, a device commonly used in a circuit board or a chip, such as a resistor, a capacitor or the like.

Figure 5:
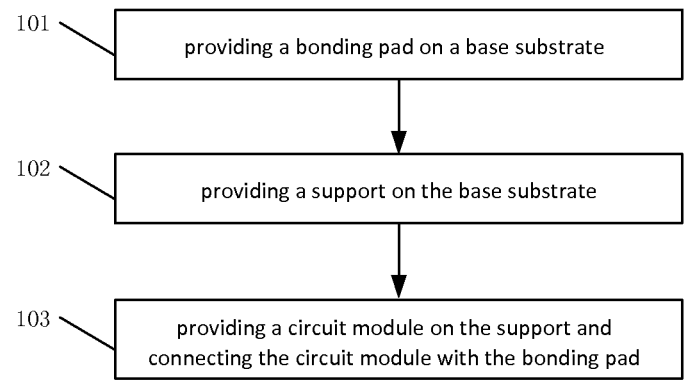
FIG. 5 is a flow chart of a manufacturing method of a circuit board provided by a fourth embodiment of the present invention.

FIG. 5 is a flow chart of a manufacturing method of a circuit board provided by the fourth embodiment of the present invention. As shown in FIG. 5, the method may comprise the following steps.

Step 101: providing a bonding pad on a base substrate.

Figure 6A:
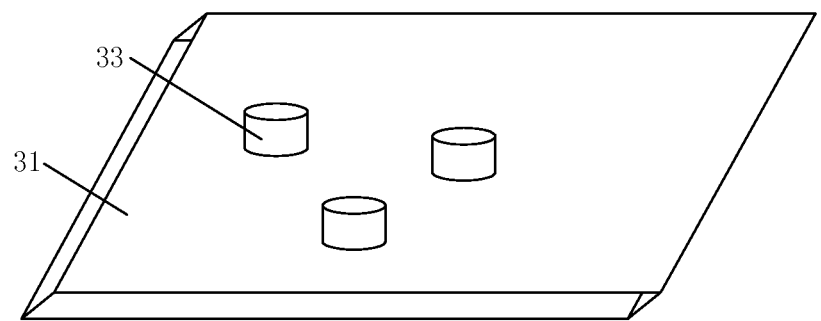
FIG. 6a is a schematic diagram of providing a bonding pad on a base substrate in the fourth embodiment of the present invention.

FIG. 6a is a schematic diagram of providing a bonding pad 33 on a base substrate 31 in the fourth embodiment. As shown in FIG. 6a, the bonding pad 33 is provided in predetermined locations on the base substrate 31. Specifically, a bonding pad material layer may be deposited on the base substrate 31, and then the bonding pad material layer is formed into the bonding pad 33 through a patterning process. The bonding pad material layer may be deposited on the base substrate 31 through a magnetron sputtering process.

Step 102: providing a support on the base substrate.

Figure 6B:
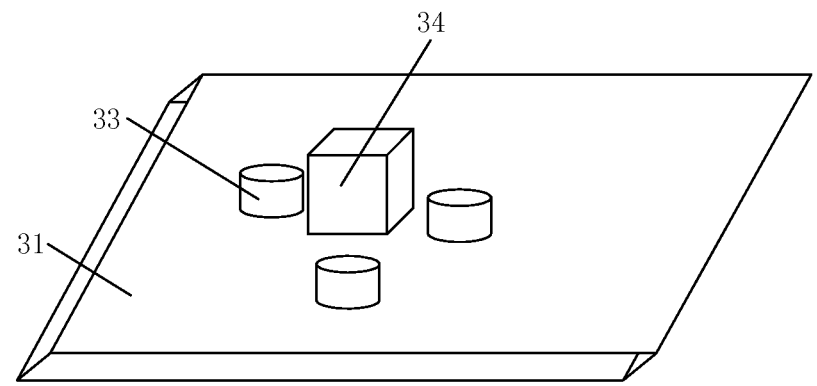
FIG. 6b is a schematic diagram of providing a support on the base substrate with the bonding pad provided thereon in the fourth embodiment of the present invention.

FIG. 6b is a schematic diagram of providing a support 34 on the base substrate 31 with the bonding pad 33 provided thereon in the fourth embodiment. As shown in FIG. 6b, the support 34 is provided on the base substrate 31. Specifically, the support 34 may be grown among the plurality of bonding pads 33 on the base substrate 31.

Step 103: providing a circuit module on the support and connecting the circuit module with the bonding pad.

Specifically, the step 103 may comprise the following steps:

Step 1031: providing the circuit module on the support such that pins of the circuit module face toward the base substrate (as shown in FIG. 2).

Step 1032: connecting the pins of the circuit module with the bonding pad. Specifically, the pins of the circuit module are soldered to the bonding pad 33 via bonding wires 35. The bonding wires 35 may be soldered to the bonding pad 33 by using a solder. For example, the solder may include A6D/HA6 silver conductive adhesive of SeaZheng Co., LTD. or HF-1021AB copper conductive adhesive of Hua Fei New Material. The solder is not limited herein as long as it can solder the bonding wires 35 and the bonding pad 33 together well.

Further, the method of the present embodiment may further comprise the following step.

Step 104: integrally packaging the base substrate in a dropping-from-top manner such that a packaging layer is formed on the circuit module and the bonding pad and the packaging layer covers the base substrate.

Figure 6C:
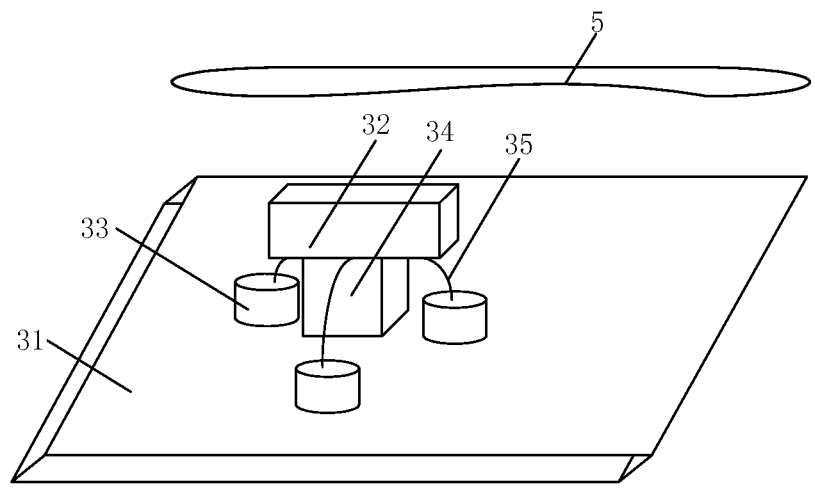
FIG. 6c is a schematic diagram of forming a packaging layer on the base substrate with the bonding pad, the support and the circuit module provided thereon in the fourth embodiment of the present invention.

FIG. 6c is a schematic diagram of forming a packaging layer on the base substrate with the bonding pad, the support and the circuit module provided thereon in the fourth embodiment. As shown in FIG. 6c, the base substrate 31 is packaged integrally in a dropping-from-top manner such that a packaging layer 5 is formed on the circuit module and the bonding pad 33 and the packaging layer 5 covers the base substrate 31.

The manufacturing method of a circuit board provided by the present embodiment may be used to fabricate the circuit board provided by the first embodiment, and for detailed description of the structure of the circuit board, reference can be made to the first embodiment and FIG. 2, and no repeated description will be made here.

In the technical solution of the manufacturing method of a circuit board provided by the present embodiment, the bonding pad and the support are provided on the base substrate, the device to be soldered (for example, the circuit module) is provided on the support and is connected with the bonding pad, therefore the short circuit of the device to be soldered during the process of soldering can be effectively prevented and the product yield can be increased. As compared with the prior art in which the device to be soldered is provided on the PCB, the present embodiment replaces the PCB in the prior art with the base substrate, i.e., the device to be soldered is provided on the base substrate. Because the base substrate in the circuit board may use a same material as the base substrate in the display panel, the circuit board and the display panel can be produced by a same manufactory and thus product manufacturing cycle can be shortened. Furthermore, the thickness of the base substrate is smaller than the thickness of the PCB, therefore the thickness of the display apparatus is decreased, which provides a solution for developing an ultra-thin display apparatus in the future. As compared with the prior art in which different circuit modules need to be provided on different PCBs, all the devices to be soldered may be provided on a same base substrate in the present embodiment, therefore the space occupied by the devices to be soldered is reduced, the integration level is increased, the circuit impedance is decreased, the path length is shortened, and the operation speed is increased. In the present embodiment, since a transparent substrate may be used as the base substrate and the material of the bonding pad may be a transparent conductive material, the fabricated circuit board is transparent except the soldering area (i.e., the area where the circuit module is soldered), which brings a better visual perception to the customers as compared with the opaque PCB in the prior art.

Fifth Embodiment

Figure 7:
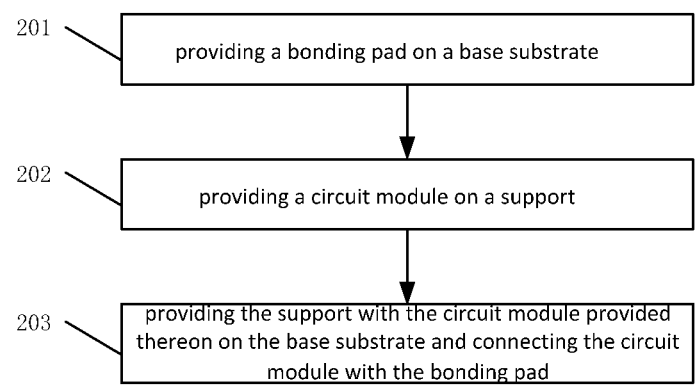
FIG. 7 is a flow chart of another manufacturing method of a circuit board provided by a fifth embodiment of the present invention.

The fifth embodiment of the present invention provides another manufacturing method of a circuit board. FIG. 7 is a flow chart of another manufacturing method of a circuit board provided by the fifth embodiment of the present invention. As shown in FIG. 7, the method may comprise the following steps.

Step 201: providing a bonding pad on a base substrate.

Figure 8A:
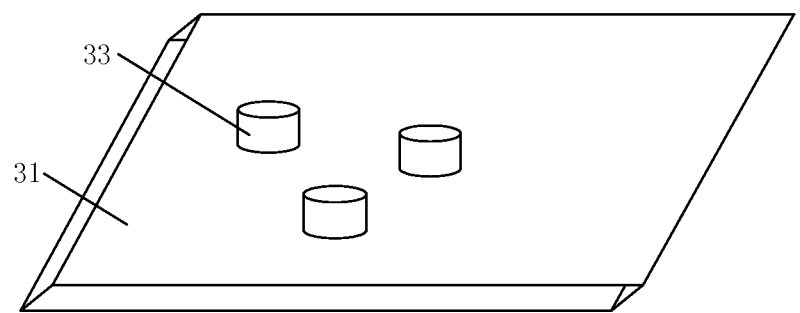
FIG. 8a is a schematic diagram of providing a bonding pad on the base substrate in the fifth embodiment of the present invention.

FIG. 8a is a schematic diagram of providing a bonding pad 33 on a base substrate 31 in the fifth embodiment. As shown in FIG. 8a, the bonding pad 33 is provided in predetermined locations on the base substrate 31. Specifically, a bonding pad material layer may be deposited on the base substrate 31, and the bonding pad material layer is formed into the bonding pad 33 through a patterning process. The bonding pad material layer may be deposited on the base substrate 31 through a magnetron sputtering process.

Step 202: providing a circuit module on a support.

Figure 8B:
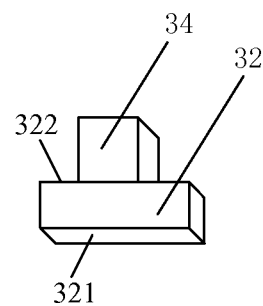
FIG. 8b is a schematic diagram of providing a circuit module on a support in the fifth embodiment of the present invention.

FIG. 8b is a schematic diagram of providing a circuit module on a support in the fifth embodiment. As shown in FIG. 8b, a packaging structure (not shown in FIG. 8b) is provided on a packaging side 322 of the circuit module, and the circuit module is packaged on the support 34 via the packaging structure (at this time, the packaging side 322 of the circuit module faces toward the support 34). The packaging side 322 of the circuit module is opposite to a side 321 of the circuit module where the pins of the circuit module are located. Specifically, the packaging structure may be soldered on the support 34 by using silver paste.

Step 203: providing the support with the circuit module provided thereon on the base substrate and connecting the circuit module with the bonding pad.

In step 203, the step of connecting the circuit module with the bonding pad specifically is: connecting the pins of the circuit module with the bonding pad 33 (as shown in FIG. 3), and specifically, connecting the pins of the circuit module with the bonding pad 33 via bonding wires 35. The bonding wires 35 may be soldered to the bonding pad 33 by using a solder. For example, the solder may include A6D/HA6 silver conductive adhesive of SeaZheng Co., LTD. or HF-1021AB copper conductive adhesive of Hua Fei New Material. The solder is not limited herein as long as it can solder the bonding wires 35 and the bonding pad 33 together well.

Further, the method of the present embodiment may further comprise the following step.

Step 204: integrally packaging the base substrate in a dropping-from-top manner such that a packaging layer is formed on the circuit module and the bonding pad and the packaging layer covers the base substrate.

Figure 8C:
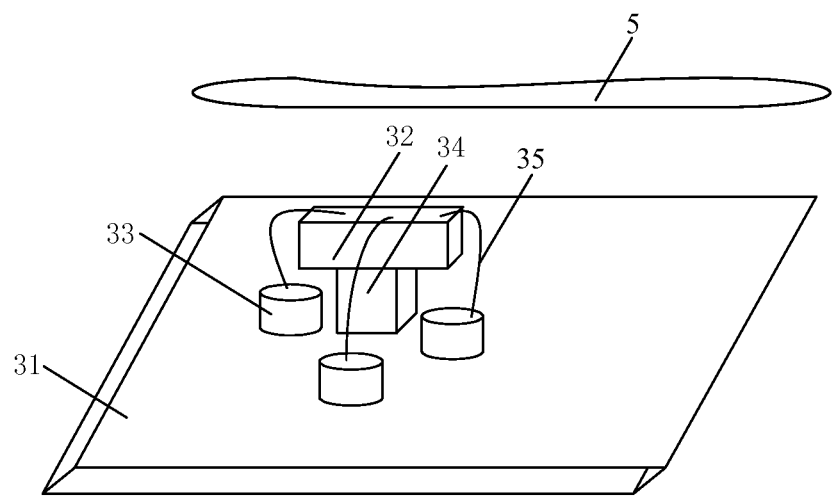
FIG. 8c is a schematic diagram of forming a packaging layer on the base substrate with the bonding pad, the support and the circuit module provided thereon in the fifth embodiment of the present invention.

FIG. 8c is a schematic diagram of forming a packaging layer on the base substrate with the bonding pad, the support and the circuit module provided thereon in the fifth embodiment. As shown in FIG. 8c, the base substrate 31 is packaged integrally in a dropping-from-top manner such that a packaging layer 5 is formed on the circuit module and the bonding pad 33 and the packaging layer 5 covers the base substrate 31.

The manufacturing method of a circuit board provided by the present embodiment may be used to fabricate the circuit board provided by the second embodiment, and for detailed description of the structure of the circuit board, reference can be made to the second embodiment and FIG. 3, and no repeated description will be made here.

In the technical solution of the manufacturing method of a circuit board provided by the present embodiment, by providing the bonding pad on the base substrate, providing the circuit module on the support, then providing the support with the circuit module provided thereon on the base substrate and connecting the circuit module with the bonding pad, the short circuit of the circuit module during the process of soldering can be effectively prevented and the product yield can be increased. As compared with the prior art in which the circuit module is provided on the PCB, the present embodiment replaces the PCB in the prior art with the base substrate, i.e., the circuit module is provided on the base substrate. Because the base substrate in the circuit board may use a same material as the base substrate in the display panel, the circuit board and the display panel can be produced by a same manufactory and thus product manufacturing cycle can be shortened. Furthermore, the thickness of the base substrate is smaller than the thickness of the PCB, therefore the thickness of the display apparatus is decreased, which provides a solution for developing an ultra-thin display apparatus in the future. As compared with the prior art in which different circuit modules need to be provided on different PCBs, all the circuit modules can be provided on a same base substrate in the present embodiment, therefore the space occupied by the circuit modules is reduced, the integration level is increased, the circuit impedance is decreased, the path length is shortened, and the operation speed is increased. In the present embodiment, since a transparent substrate may be used as the base substrate and the material of the bonding pad may be a transparent conductive material, the fabricated circuit board is transparent except the soldering area (i.e., the area where the circuit module is soldered), which brings a better visual perception to the customers as compared with the opaque PCB in the prior art.

It is appreciated that the above embodiments are only exemplary embodiments adopted for illustrating the principle of the present invention and the present invention is not limited thereto. Without departing from the spirit and essence of the present invention, one ordinary person skilled in the art may make various variations and modifications which shall be deemed within the scope of the present invention.

What is claimed is:

1. A circuit board comprising:
a base substrate having a top surface, wherein the base substrate comprises glass;
at least three bonding pads protruding from the top surface of the base substrate;
a circuit device corresponding to the at least three bonding pads, the circuit device including at least three pins facing towards the base substrate; and
a support positioned on the base substrate among the at least three bonding pads, the circuit device positioned on and supported by the support, and the at least three pins of the circuit device connected with corresponding ones of the at least three bonding pads via bonding wires soldered to the bonding pads.

2. The circuit board according to claim 1, wherein the circuit device includes one or more devices to be soldered and the support includes one or more supports, and there is a one-to-one correspondence between the device(s) to be soldered and the support(s).

3. The circuit board according to claim 1, wherein the base substrate is a transparent substrate.

4. The circuit board according to claim 1, wherein a height of the support is greater than a height of the bonding pads.

5. The circuit board according to claim 1, wherein the number of the pins of the circuit device is equal to the number of the bonding pads to which the circuit module corresponds.

6. The circuit board according to claim 1, wherein a material of the support is an insulating material.

7. The circuit board according to claim 1, wherein a material of the bonding pad is a transparent conductive material.

8. The circuit board according to claim 1, wherein the circuit board further comprises a packaging layer that is positioned on the circuit device and the bonding pad, and covers the base substrate.

9. A display apparatus comprising a display panel and the circuit board according to claim 1 connected with the display panel.

10. A method of manufacturing a circuit board, the method comprising:
positioning a circuit device, at least three bonding pads and a support on a base substrate with the at least three bonding pads protruding from a top surface of the base substrate, the support positioned among the at least three bonding pads, and the circuit device positioned on and supported by the support, wherein the base substrate comprises glass and the circuit device includes at least three pins facing towards the base substrate; and connecting the at least three pins of circuit device with corresponding ones of the at least three bonding pads via bonding wires soldered to the bonding pads.

11. The method of manufacturing a circuit board according to claim 10, wherein positioning the circuit device, the bonding pads and the support on the base substrate comprises:

positioning the bonding pads on the base substrate;

positioning the support on the base substrate;

positioning the circuit device to be soldered on the support with the pins of the circuit device facing toward the base substrate; and connecting the pins of the circuit device with the corresponding ones of the bonding pads.

12. The method of manufacturing a circuit board according to claim 10, wherein positioning the circuit device, the bonding pads and the support on the base substrate comprises:

positioning the bonding pads on the base substrate;

positioning a packaging structure on a packaging side of the circuit device which is opposite to a side of the circuit device where the pins of the circuit device are located;

positioning the circuit device on the support via the packaging structure such that the packaging side of the circuit device faces toward the support; and positioning the support with the circuit device provided thereon on the base substrate and connecting the pins of the circuit device with the corresponding ones of the bonding pads.

13. The method of manufacturing a circuit board according to claim 10, wherein positioning the bonding pads on the base substrate comprises:

depositing a bonding pad material layer on the base substrate and forming the bonding pad material layer into the bonding pads through a patterning process.

14. The method of manufacturing a circuit board according to claim 10, further comprising:

subsequent to connecting the circuit device with the bonding pads, integrally packaging the base substrate in a dropping-from-top manner such that a packaging layer is formed on the circuit device and the bonding pads, and the packaging layer covers the base substrate.

15. The method of manufacturing a circuit board according to claim 10, wherein the number of the pins of the circuit device is equal to the number of the bonding pads.

* * * * *